United States Patent
Wagman

(10) Patent No.: US 6,751,361 B1
(45) Date of Patent: Jun. 15, 2004

(54) METHOD AND APPARATUS FOR PERFORMING FIXTURING IN A MACHINE VISION SYSTEM

(75) Inventor: Adam Wagman, Framingham, MA (US)

(73) Assignee: Cognex Corporation, Natick, MA (US)

( * ) Notice: Subject to any disclaimer, the term of this patent is extended or adjusted under 35 U.S.C. 154(b) by 609 days.

(21) Appl. No.: 09/747,814

(22) Filed: Dec. 22, 2000

(51) Int. Cl.$^7$ .............................. G06K 9/36; G06K 9/00; G06K 9/54

(52) U.S. Cl. ....................... 382/287; 382/151; 382/306; 382/103

(58) Field of Search ................................. 382/103, 145, 382/141, 147, 151, 154, 190, 195, 203, 287, 288, 289, 294, 306; 348/87, 94, 95

(56) References Cited

U.S. PATENT DOCUMENTS

| | | | |
|---|---|---|---|
| 5,859,923 A | * 1/1999 | Petry et al. | 382/141 |
| 5,960,125 A | 9/1999 | Michael et al. | |
| 5,974,365 A | 10/1999 | Mitchell | |
| 5,978,521 A | * 11/1999 | Wallack et al. | 382/294 |
| 6,130,959 A | * 10/2000 | Li | 382/150 |
| 6,137,893 A | * 10/2000 | Michael et al. | 382/103 |
| 6,173,070 B1 | * 1/2001 | Michael et al. | 382/145 |
| 6,396,942 B1 | * 5/2002 | Chang et al. | 382/141 |
| 6,424,734 B1 | * 7/2002 | Roberts et al. | 382/151 |
| 6,539,107 B1 | * 3/2003 | Michael et al. | 382/154 |

FOREIGN PATENT DOCUMENTS

JP          06-132189          5/1994

OTHER PUBLICATIONS

Cognex Corporation, Cognex MVS–8000 Series, SMD4 Inspection Tools User's Guide, Revision 1.1, 2000.

Cognex Corporation, Cognex MVS–8000 Series, CVL Vision Tools Guide, CVL 5.4, 2000.

David I. Havenlock, *Geometric Precisionin Noise–Free Digital Images*, IEEE Transaction on Pertern Analysis and Machine Intelligence, vol. II No. 10, Oct. 1989.

Alfred M. Bruckstein, Larry O'Gorman and Alon Orlitsky, *Design of Shapes for Precise Image Registration*, IEEE Transactions on Information Theory, vol. 44, No. 7, Nov. 1998.

Lawrence O'Gorman, *Subpixel Precision of Straight–Edged Shapes for Registration and Measurement*, IEEE Transactions on Pattern Analysis and Machine Intelligence, vol., 18, No. 7, Jul. 1996.

W. Makous, *Optimal patterns for Alignment*, Applied Optics vol. 13, No. pp. 659–664, Mar. 1974.

Neal T. Sullivan, *Semiconductor Pattern Overlay*, Digital Equipment Corp., Advanced Semiconductor Development, Critical Dimension Metrology and Process Control pp. 160–186.

(List continued on next page.)

*Primary Examiner*—Andrew W. Johns
*Assistant Examiner*—Amir Alavi
(74) *Attorney, Agent, or Firm*—Paul Kudirka

(57) ABSTRACT

A single non-rotationally symmetric fiducial mark, such as a Universal Alignment Target, is placed on an object and the alignment of the object is determined with a vision tool that can align objects with translation and at least one additional degree of freedom, such as angular orientation. Alternatively, if a unique non-rotationally symmetric feature occurs naturally on the object, that feature may be used instead of a fiducial mark. In one embodiment, a geometrical feature matching vision tool is used to locate the single fiducial mark. In another embodiment, a normalized correlation search tool is used to locate the mark. The tool internally generates a set of rotated and scaled patterns that are then stored. The stored patterns are subsequently used to perform the search. In still another embodiment, a normalized correlation search tool internally generates a set of rotated and scaled patterns at runtime when the search for the mark is being performed.

29 Claims, 6 Drawing Sheets

OTHER PUBLICATIONS

John W. Hill, *Dimensional Measurements From Quantized Images*, Machine Intelligence Research Applied to Industrial Automation, U.S. Department fo Commerce, SRI International, Menlo Park, Ca, Nov. 1980.

H.F. Gillespie and J.E. Martin, *Optimization of Optical Alignment Marks Through Circuit Design Rule Consideration*, Rockwell Interational Corporation, Newport Beach, California, 1978.

Egil D. Castel and Nader Shamma, *Design and Optimization of Site–By–Site Aligment Marks for a Single Polysilicon Bipolar Process*, Elsevier Science Publishers B.V., Holland, 1989.

Chinmoy B. Bose and Israel Amir, *Design of Fiducials for Accurate Registration Using Machine Vision*, IEEE Transactions on Pattern Analysis and Machine Intelligence, vol. 12, No. 12, Dec. 1990.

* cited by examiner-

FIG. 3 *(Prior Art)*

METHOD AND APPARATUS FOR PERFORMING FIXTURING IN A MACHINE VISION SYSTEM

FIELD OF THE INVENTION

This invention relates to machine vision systems for object location and inspection and, more particularly, to techniques for fixturing targets.

BACKGROUND OF THE INVENTION

In many applications, it is necessary to determine the two-dimensional location or translation and angular orientation of an object of interest. Depending on the application, a determination of one or more of these properties is called determining the "alignment" of an object. In some applications, alignment also may include additional degrees of freedom, such as scale, aspect, shear or even various types of non-linear deformations. For example, in a robotic assembly system, it may be necessary to determine the alignment of a printed circuit board so that a robotic arm can place an integrated circuit onto the board at a precise location. One way to perform this alignment is to mechanically constrain the board at a predetermined location and angular orientation. Guides, brackets and many other well-known mechanical arrangements can be used to accomplish this alignment. However, in other applications, it is not feasible to mechanically constrain each object. In these latter systems, machine vision systems are often used to determine the alignment of objects.

Machine vision systems acquire images of an environment, process the images to detect objects and features in the images and then analyze the processed images to determine characteristics of objects and other features detected in the images. The system generally includes a camera/frame grabber system that generates an image that consists of a plurality of digitized image pixels. The image pixels are then processed with an algorithm implemented in software and/or hardware typically called a vision "tool." These systems can be used to determine the alignment of objects, such as printed circuit boards.

One way to perform this alignment is to acquire an image of the entire object and then use the vision system to determine the alignment of the object. However, since some objects can be quite large, the image acquisition apparatus may not be able to acquire an image of the entire object. Thus, the image may be constrained to only a portion of the object at any one time. Further, even if the entire image can be acquired at once, the processing time required to process the large image might be prohibitive. Also, examining only a portion of the entire image allows the alignment procedure to ignore substantial variations in the object in regions outside the selected portion; for example, circuit boards with different circuit trace patterns could be treated equivalently so long as the selected portions were similar or had similar identifying marks.

Consequently, in many applications, the alignment of an object is determined by examining only selected areas of the object. In order to facilitate this examination "fiducial" marks are placed on the object in the selected areas. These marks might comprise one or more small circles, squares or other shaped marks, where the shape is selected so that it would not occur on the object for any reason other than a fiducial mark. Then, the machine vision system can be instructed to examine the selected areas of the object and to locate the fiducial marks within these areas. The marks assist in determining the alignment of the object because they are in predetermined location is on the object.

Although fiducial marks work well, the alignment problem is complicated because the fiducial marks are generally placed on the object during the manufacture of the object. For example, fiducial marks can be placed on a printed circuit board by etching the marks into the board during the circuit board manufacturing process. However, manufacturing tolerances can distort or degrade the marks. In the case of etching, the etching process can change the original size of the mark if the edges of the mark are over etched or the mark can be distorted during the etching process, which distortion might, for example, distort a circular mark into an oval-shaped mark. Also, the angular orientation of the object, and thus of the fiducial mark on the object, with respect to the camera may not be precisely known. Therefore, the vision tool used to locate the marks must be capable of tolerating some variations in size, shape and angular orientation and still locate the mark.

The manner of determining the alignment of the object depends on the type of vision tool used to locate the marks. Some tools can tolerate variations in size, shape and angular orientation during the location procedure, but have other deficiencies. For example, the earliest vision tool widely used for object location and inspection in industry was blob analysis. In this type of tool, image pixels are classified as object or background pixels by some means, the object pixels are joined to make discrete sub-objects using neighborhood connectivity rules, and various moments of the connected sub-objects are computed to determine object position, size, and orientation. Blob analysis tools can tolerate and measure variations in orientation and size.

However, such tools cannot tolerate the presence of various forms of image degradation. A more serious problem was that the only generally reliable method ever found for separating object pixels from background pixels was to arrange for the objects to be entirely brighter or entirely darker than the background. This requirement is difficult to achieve in other than the most controlled conditions.

In order to overcome the limitations of blob analysis tools, techniques called "template matching" tools were developed to locate objects based on their pattern rather than grayscale intensities. A template matching tool typically starts with a training step. In this step, a software representation called a pattern, or template, of an image or synthetic description of an ideal object is created and stored. At run-time, the template is moved in various positions over the digitized image and compared to like-sized pixel subsets of the image. The position where the best match between the template and image sub-set pixels occurs is taken to be the position of the object. Because a "search" is performed for the best match, this type of tool is often called a search tool. The degree of match (a numerical value) can be used for inspection, as can comparisons of individual pixels between the template and image at the position of best match.

The first template matching tools used a brightness threshold to reduce the pixels of the template and image to two states: "bright" and "dark." This reduced the computation necessary for the comparison operation to a reasonable level for the available computation facilities. Unfortunately, the thresholding step made sub-pixel accuracy impractical and made the results highly susceptible to the selection of the threshold and variations in illumination and object reflectivity.

Later tools overcame the thresholding problem by using a normalized correlation operation for the template and image comparison step, albeit at the cost of considerable additional computation. Normalized correlation template matching tools also overcame many of the limitations of blob analysis tools—they can tolerate touching or overlapping objects, they perform well in the presence of various forms of image degradation, and the normalized correlation match value is useful in some inspection applications. Most significantly, perhaps, in order for the tool to operate properly, objects need not be separated from background by brightness, enabling a much wider range of applications.

Unfortunately, while normalized correlation template matching tools work well in determining the location of objects that are translated, they will tolerate only small variations in angular orientation and size: typically a few degrees and a few percent (depending on the specific template). Even within this small range of orientation and size variation, the accuracy of the results falls off rapidly when the objects deviate from fixed sizes and orientations and such a system may not be able to distinguish between two objects that do not differ much in size.

Other search tools have been devised that can determine the alignment of objects in the presence of variations in one or more other characteristics or "degrees of freedom" in addition to translation. For example, such tools may be able to determine the alignment of objects in the presence of significant variations in translation and rotation, translation and size or translation and skew. Other tools can determine the alignment of objects in the presence of variations in multiple degrees of freedom, such as variations in translation, rotation and size. These tools can be used to locate objects in the presence of such variations.

For example, normalized correlation matching tools have been extended to tolerate variations in several degrees of freedom by using multiple templates in the search. In order to accommodate objects that vary in size, a separate template for each object size is created and stored during the training process. Similarly, in order to accommodate objects that have been rotated, a separate template is created for each object that is rotated with a different degree of rotation.

However, with such tools, a separate pattern must be trained for each object size and each orientation of each object size, and then a search must be performed using each pattern over the entire runtime image. Each pattern occupies computer memory, and, depending on the techniques and the size or complexity of the training image or description, a typical pattern may occupy tens or hundreds of kilobytes or even several megabytes of memory. Aside from the training time required to create the patterns, a large number of patterns can easily consume large amounts of memory. If the patterns are stored in a central location and downloaded to local computers when needed, the network connecting the computers must have significant bandwidth. Further, the need to search the image with a large number of patterns increases the search time significantly. In addition, because patterns must be created for each size and rotation, the patterns are created in discrete steps and the accuracy of the system suffers.

Still other search tools use geometric feature matching to locate and determine the alignment of objects with variations in several degrees of freedom, such as translation, rotation and size. In these systems, a feature detection algorithm produces a geometric description of object boundaries. This geometric description comprises a set of boundary points that lie along contours separating dissimilar regions in the image. Each boundary point specifies both position and orientation. In this system, the training process uses a training pattern to select features to represent the object. Once the boundary points have been generated, they can be transformed by parameterized mathematical algorithms to produce translated, rotated, scaled, and stretched patterns. The pattern search is thereby reduced to searches over parameter values. An example of such a system is the PatMax® search tool developed and sold by Cognex Corporation, One Vision Drive, Natick, Mass.

Other vision tools are available that can locate and determine the alignment of objects with variations in several degrees of freedom. These vision tools include the Hex-Sight® Locator machine vision system developed and sold by Adept Technology, Inc., San Jose, Calif. and SMART Search® machine vision system developed and sold by Imaging Technology, Inc., 55 Middlesex Turnpike, Bedford, Mass. 01730.

In order to accommodate vision tools that do not tolerate variations in size and angular orientation well, fiducial marks are typically arranged to have rotational symmetry. For example, a small circle may be used. In this manner, the vision tool can still locate the fiducial mark although the mark may appear rotated in the image, as might be the case if the object were not fixtured with respect to the camera. Because the fiducial marks have rotational symmetry, once a mark is located, it cannot be used to determine the rotational alignment of the object on which it is located. Therefore, it is common practice to use two fiducial marks. Once both marks have been located, the rotational alignment of the object can be determined.

In order to increase the accuracy of the determination of rotational alignment using two marks, the marks are usually separated by a significant distance. For example, the marks might be located at opposite ends of an object. One problem with this arrangement is that when the object is processed with a camera that has a limited field of view, either the camera or the object must be moved in order to locate both marks. Further, two separate images must be acquired and processed, thereby lengthening the processing time to determine the alignment of the object. In addition, the marks occupy space on the object which, in some cases, is at a premium. Further, additional time is required during the manufacturing process to place additional marks on each object.

Therefore, there is a need for a method and apparatus that can quickly and accurately determine the alignment of an object using fiducial marks.

SUMMARY OF THE INVENTION

In accordance with the principles of the present invention, a single non-rotationally symmetric fiducial marks is placed on an object and the alignment of the object is determined with a vision tool that can align objects with both angular orientation and translation. Alternatively, if a unique non-rotationally symmetric feature occurs naturally on the object, that feature may be used instead of a fiducial mark. In one embodiment, a geometrical feature matching vision tool is used to locate the single fiducial mark.

In another embodiment, a normalized correlation search tool is used to locate the mark. The tool internally generates a set of rotated and scaled patterns that are then stored. The stored patterns are subsequently used to perform the search.

In still another embodiment, a normalized correlation search tool internally generates a set of rotated and scaled patterns at runtime when the search for the mark is being performed.

BRIEF DESCRIPTION OF THE DRAWINGS

The above and further advantages of the invention may be better understood by referring to the following description in conjunction with the accompanying drawings in which.

DETAILED DESCRIPTION

Figure 1:
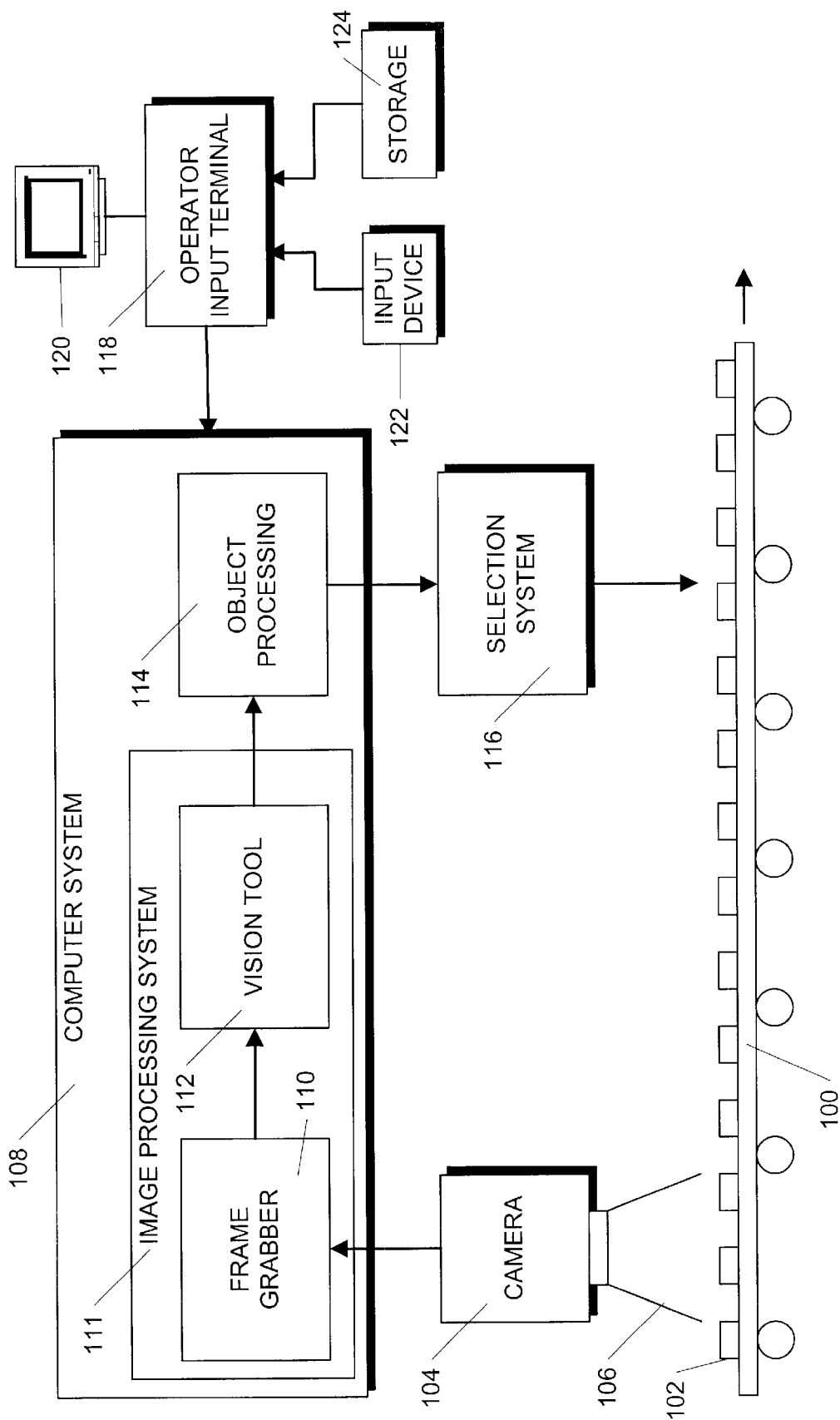
FIG. 1 is a schematic block diagram of a conventional machine vision system.

FIG. 1 illustrates in schematic form an example of a machine vision system that can utilize the process of the present invention. In the example system, a conveyor 100 moves to the right and carries objects 102 to be examined. The objects may also be presented to the system by other well-known mechanisms. As the objects pass on the conveyor 100, an image stream of the objects is created by a camera system 104 in a conventional manner. Camera 104 may have built in illumination as indicated schematically at 106 or a separate light source may be provided. The image stream created by the camera 104 is provided to computer system 108 which processes the image by comparing patterns in the image to a model pattern.

Figure 2:
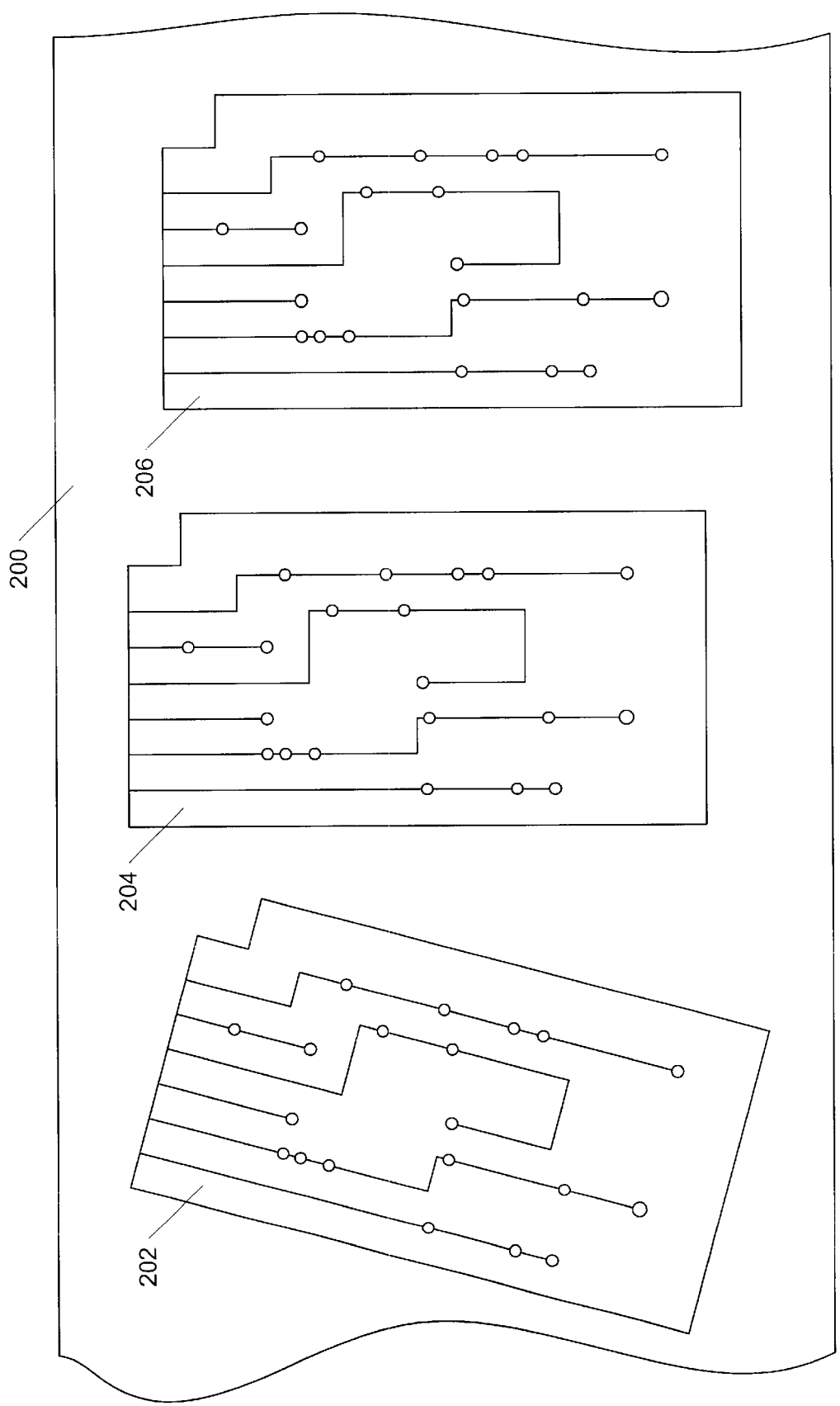
FIG. 2 is a schematic diagram illustrating printed circuit boards on a material conveyance system for which the machine vision system of FIG. 1 can be used to determine the alignment.

FIG. 2 shows a material conveyance system 200 that carries objects 200, in this case, printed circuit boards 202–206, past a machine vision system, such as that shown in FIG. 1. In general, it is necessary to determine the alignment of printed circuit boards 202–206 with respect to a fixed coordinate system. Once this alignment has been determined, the boards may be processed. For example, a robot manipulator arm that is also referenced to the same fixed coordinate system can be used to place parts or components into predetermined locations on the boards. However, since printed circuit boards 202–206 are not physically constrained on the material conveyance device 200, they may be translated or rotated with respect to each other and with respect to the fixed coordinate system. Consequently, the machine vision system must determine the relative position of each board 202–206 with respect to the coordinate system.

The computer system 108 in general comprises an image processing system 111 and an object processing system 114. The image processing system, in turn, includes a frame grabber 110 that creates a series of fixed images from the image stream generated by camera 104. The series of fixed images are provided to a vision tool 112 that locates fiducial marks on objects in the image. In accordance with the principles of the present invention, the vision tool is a search tool that can process images with a degree of freedom in addition to translation and that uses a trained template to search the image for the fiducial marks as discussed below.

With some vision tools, the location and angular orientation of the fiducial marks with respect to a fixed coordinate system are produced directly by the vision tool. With other vision tools, the outputs of the tool must be processed further in a conventional manner to calculate the location and angular orientation of the fiducial marks. Once the fiducial marks have been located and aligned, further processing may be performed as indicated by block 114 to determine the translational and rotational alignment of the objects on which the fiducial marks are placed. This object alignment is then used to control a selection or manipulation system 116. The selection and manipulation system treats each object 102 based on the results of the object processing 114.

In preparation for processing, an operator first "trains" the system to establish a model template or pattern via the operator input terminal 118. This training may be performed in several manners. For example, an image containing the object of interest may be presented to the operator on a display 120 associated with terminal 118. The operator can then select an object of interest by "drawing" a box around the object using an input device 122 or by other suitable means. Once the object has been selected, the computer system 108 may use the object image as the pattern. Alternatively, after an object is selected, additional processing may be performed in order to sharpen edges, simplify the image, etc. Instead of selecting a portion of an image, an operator can enter parameters that describe an ideal image model, such as by providing CAD information.

Figure 3:
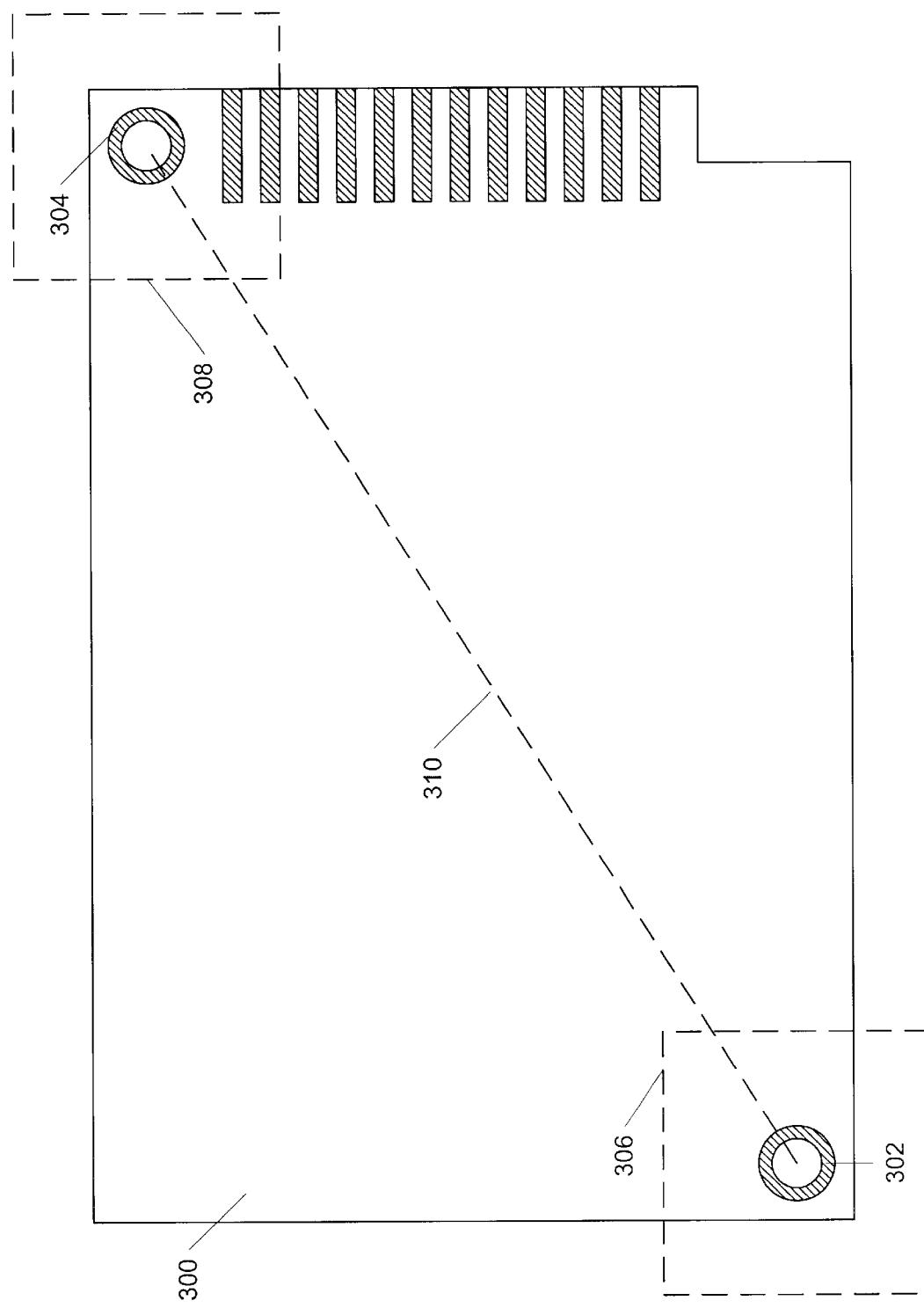
FIG. 3 is a diagram illustrating a conventional method of determining the alignment of an object with a machine vision system using two fiducial marks.

FIG. 3 shows a conventional method for determining the alignment of an object, such as a printed circuit board 300. Two fiducial marks 302 and 304 are used. As shown in FIG. 3, marks 302 and 304 are circular and are rotationally symmetrical. Although circular marks are shown, other mark shapes with rotational symmetry could also be used. The rotational symmetry allows the marks to be located with vision tools that do not tolerate significant variations in angular alignment. In addition, the marks are shown enlarged for clarity. In reality, the marks would be considerably smaller with respect to the board so that they occupy as small an area as possible, while still being large enough that the vision tool will reliably locate them.

In operation, the horizontal and vertical edges of the board are detected. These edges can be detected by means of a light beam and photocell arrangement, mechanical feelers or any other well-known arrangement. Once the board is approximately located, the vision tool is instructed to examine a selected area on the board, such as area 306, in order to locate fiducial mark 302 with respect to the aforementioned fixed coordinate system. After mark 302 has been located, the vision tool is instructed to examine area 308 in order to locate mark 304. The position of area 308 can be calculated by any suitable means, such as dead reckoning. Alternatively, the appropriate board edges may be sensed by means of the light beam photocell arrangement or mechanical feelers as mentioned previously.

Once mark 304 has been located with respect to the fixed coordinate system, a line 310 connecting the two marks can be calculated and this line used to determine the angular orientation of the board 300 in a conventional fashion. Since two separate areas 306 and 308 must be searched at the opposite ends of the object, the disadvantages discussed above are inherent.

Figure 4:
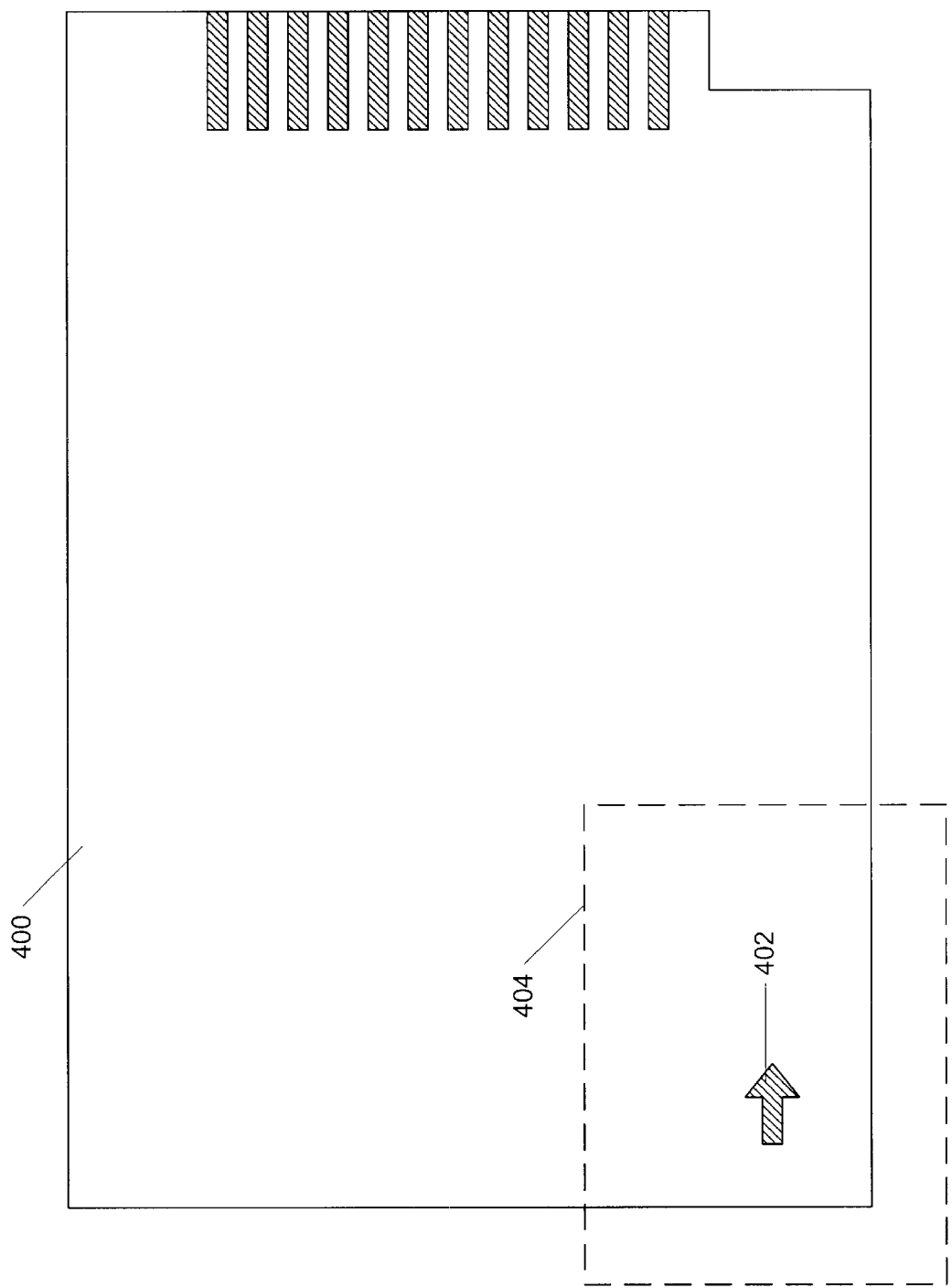
FIG. 4 is a diagram illustrating a method of determining the alignment of an object using a single non-rotationally symmetric fiducial mark.

FIG. 4 illustrates the determination of object alignment using only one fiducial mark in accordance with the principles of the invention. In this arrangement, an object, such as printed circuit board 400 is marked with a single non-rotationally symmetric mark 402. Mark 402 is placed on the board 400 in a predetermined location and with a predetermined angular position with respect to the board 400. As shown in FIG. 4, mark 402 is also enlarged for clarity. Although the mark is shown as an "arrow" shape, various other marks could be used as long as the shape does not exhibit rotational symmetry. In a preferred embodiment, the fiducial mark is a Universal Alignment Target, which is a class of target specially designed for use with machine vision systems, as described in co-pending U.S. patent application Ser. No. 09/699,614, filed Oct. 30, 2000, which application is hereby incorporated in its entirety by reference. Those skilled in the art will understand that marks with limited rotational symmetry—such as squares, rectangles and hexagons—may be used in some applications where angular orientation will vary over a limited range or need not be determined uniquely. Alternatively, if a unique non-rotationally symmetric feature occurs naturally on the object, that feature may be used instead of a fiducial mark. Some vision tools can be programmed to search the object for such a feature. In operation, the horizontal and vertical edges of the board are detected in a manner previously mentioned. Once the board is approximately located, the vision tool is instructed to examine an area such as area 404 in order to locate fiducial mark 402 with respect to the aforementioned fixed coordinate system. However, once mark 402 is located, the vision tool can also determine its angular orientation with respect to the fixed coordinate system. Since the mark 402 is placed on the board 400 in a predetermined angular orientation, once the angular alignment of the mark is known, the angular alignment of the board can be calculated.

Figure 5A:
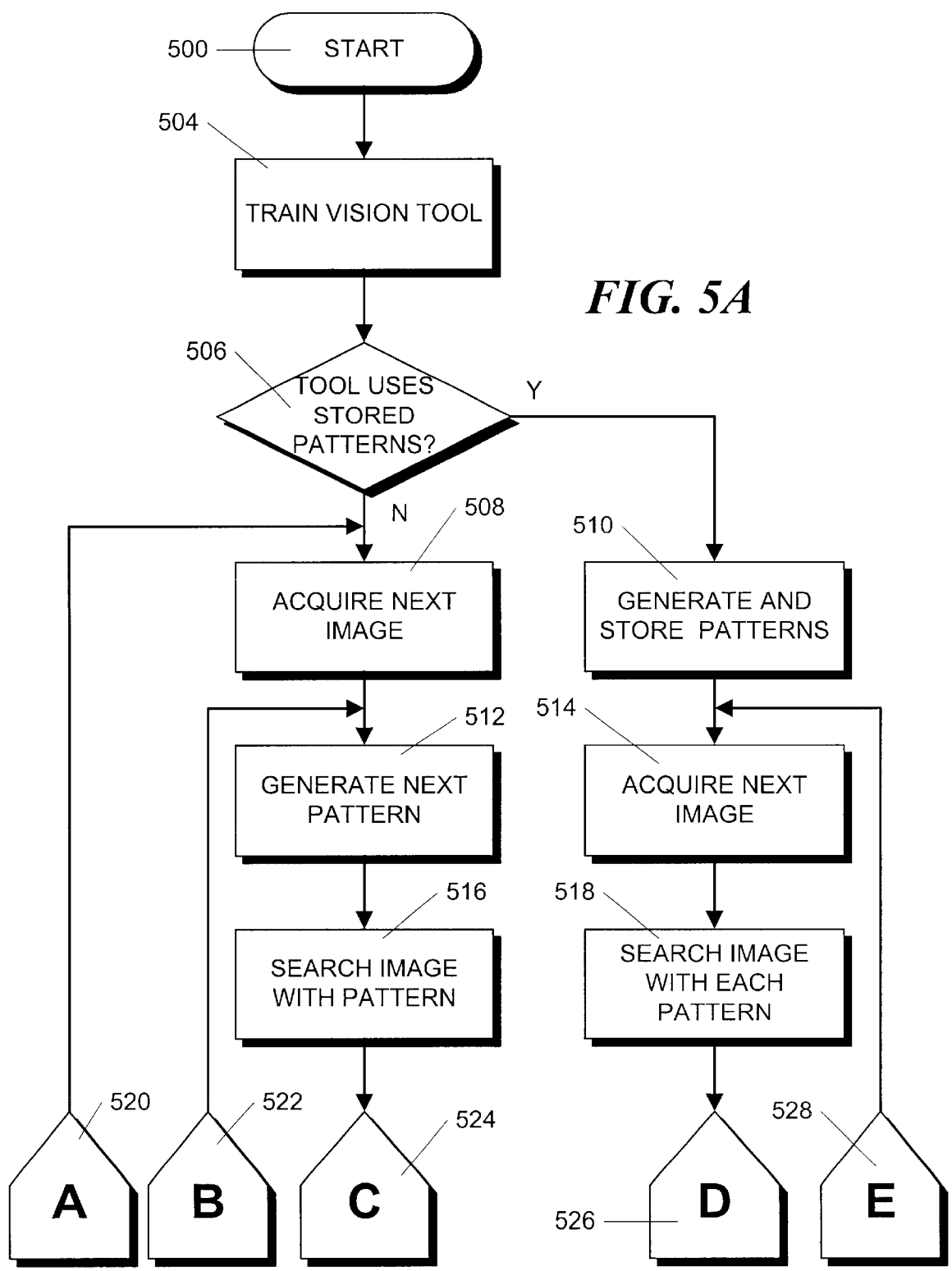
FIGS. 5A and 5B, when placed together, form a flowchart illustrating the steps in a process of determining the alignment of an object in accordance with the principles of the invention.
Figure 5B:
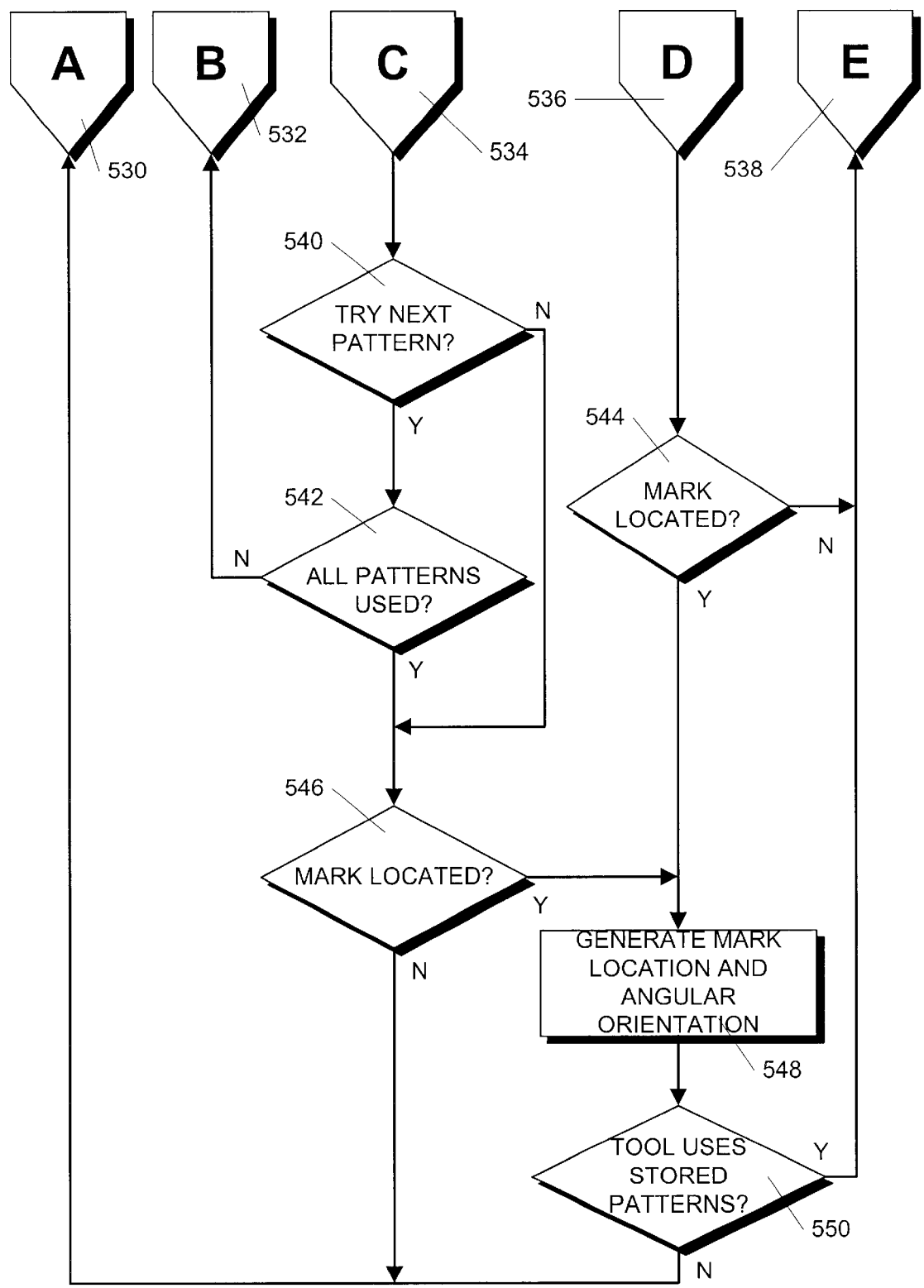

Example steps in an overall system for aligning an object with a vision tool that can process variation in at least one degree of freedom in addition to translation are shown in FIGS. 5A and 5B. The process starts in step 500 and proceeds to step 504, where the vision tool is trained. In step 506, a determination is made whether the vision tool requires multiple patterns that are pre-stored patterns. If it does, then the process proceeds to step 510 where the patterns are generated and stored. For example, the multiple patterns can be generated by transforming a single pattern used for training.

Next, in step 514, an image of the environment is obtained as discussed above. Then, in step 518 the image is searched using the stored patterns. The process then proceeds, via off-page connectors 526 and 536 to step 544 where a determination is made whether the single fiducial mark has been located. If not, the process proceeds, via off-page connectors 538 and 528 back to step 514 where another image of the environment is acquired. The system may take additional action (not shown) before returning to step 514 if the mark was not located.

Alternatively, if in step 544, a determination is made that the fiducial mark has been located, further processing generates the mark's location and angular orientation in step 548 and the process proceeds to step 550.

In step 550, a determination is made whether the vision tool uses stored patterns. If it does, then the process returns, via off-page connectors 538 and 528, to step 514 where another image is acquired. Operation continues in this manner until additional marks are located. Alternatively, if, in step 550, a determination is made that the vision tool does not use stored patterns, the process returns, via off-page connectors 530 and 520, to step 508 where another image is acquired and subsequently processed. Operation continues as additional marks are located.

If, in step 506, it is determined that the vision tool does not use stored patterns, the process proceeds to step 508 where an image is acquired. Then, in step 512, the next search pattern is generated by transforming the training pattern. In step 516, this pattern is used to search the image.

The process then proceeds, via off-page connectors 524 and 534 to step 540, where a determination is made whether another pattern should be tried. This allows for variations in the search procedure. For example, in a tool that uses multiple patterns, after a first match is obtained, the tool may still try additional patterns before making a selection to determine whether a "better" match can be obtained. Alternatively, the search may terminate when the first match is obtained. Still other variations are possible, such as selecting further patterns to try based on a match obtained for a particular pattern. These variations and other search strategies would be known to those skilled in the art. If a determination is made in step 540 that no further patterns will be tried, the process proceeds to step 546 where a determination is made whether the mark has been located in the image. If so, the mark location and angular alignment are generated in step 548. If it is determined in step 540 that additional patterns will be tried, then the process proceeds to step 542 where a determination is made whether all patterns have been used in the search. If not all patterns have been used, the process proceeds, via off-page connectors 532 and 522 back to step 512 where the next pattern is generated. Steps 516, 540, 542 and 546 are then repeated until a mark is located as determined in step 546. Alternatively, if, in step 542, a determination is made that all patterns have been used, then the process proceeds to check whether a mark has been located in step 546. If not, the process proceeds, via off-page connectors 530 and 520 back to step 508 where another image is obtained. The system may also take other action (not shown) before returning to step 508. The process then repeats until the fiducial mark is located.

A software implementation of the above-described embodiment may comprise a series of computer instructions either fixed on a tangible medium, such as a computer readable medium, e.g. a diskette, a CD-ROM, a ROM memory, or a fixed disk, or transmissible to a computer system, via a modem or other interface device over a medium. The medium either can be a tangible medium, including, but not limited to, optical or analog communications lines, or may be implemented with wireless techniques, including but not limited to microwave, infrared or other transmission techniques. It may also be the Internet. The series of computer instructions embodies all or part of the functionality previously described herein with respect to the invention. Those skilled in the art will appreciate that such computer instructions can be written in a number of programming languages for use with many computer architectures or operating systems. Further, such instructions may be stored using any memory technology, present or future, including, but not limited to, semiconductor, magnetic, optical or other memory devices, or transmitted using any communications technology, present or future, including but not limited to optical, infrared, microwave, or other transmission technologies. It is contemplated that such a computer program product may be distributed as removable media with accompanying printed or electronic documentation, e.g., shrink wrapped software, pre-loaded with a computer system, e.g., on system ROM or fixed disk, or distributed from a server or electronic bulletin board over a network, e.g., the Internet or World Wide Web.

Although an exemplary embodiment of the invention has been disclosed, it will be apparent to those skilled in the art that various changes and modifications can be made which will achieve some of the advantages of the invention without departing from the spirit and scope of the invention. For example, although only a few vision tools were explicitly discussed in the specification, those skilled in the art will appreciate that there are many other possible embodiments of a vision tool capable of aligning objects with at least one degree of freedom in addition to translation. Such embodiments include, but are not limited to, Fourier-based and wavelet-based approaches. Use of any embodiment of such a vision tool for the purposes described herein is within the spirit and scope of the invention. Other aspects, such as the specific instructions utilized to achieve a particular function, as well as other modifications to the inventive concept are intended to be covered by the appended claims.

What is claimed is:

1. A method for determining the location and angular alignment of an object with respect to a fixed coordinate system in a machine vision system with a camera and processing system for obtaining an image of the object and a vision tool capable of aligning location and at least one other non-translational degree of freedom, the method comprising:

(a) placing a single non-rotationally symmetric fiducial mark on the object at a predetermined location on the object and at a predetermined angular orientation with respect to the object;

(b) using the vision tool to process the image and locate the fiducial mark in the image and to determine its location and angular orientation with respect to the fixed coordinate system; and (c) using the location and angular orientation of the fiducial mark to calculate the location and angular orientation of the object with respect to the fixed coordinate system.

2. The method of claim 1 wherein the vision tool is a multiple pattern normalized correlation tool.

3. The method of claim 1 wherein the vision tool is a geometrical pattern matching tool.

4. The method of claim 1 wherein step (b) comprises locating a selected area of the object by means other than the vision tool and using the vision tool to process an image of the selected area.

5. The method of claim 1 wherein step (b) comprises determining the location and angular orientation of the fiducial mark directly from the outputs of the vision tool.

6. The method of claim 1 wherein step (b) comprises calculating the location and angular orientation of the fiducial mark from the outputs of the vision tool.

7. The method of claim 1 wherein the fiducial mark is a Universal Alignment Target.

8. Apparatus for determining the location and angular alignment of an object with respect to a fixed coordinate system in a machine vision system with a camera and processing system for obtaining an image of the object and a vision tool capable of aligning location and at least one other non-translational degree of freedom, the apparatus comprising:

means for placing a single non-rotationally symmetric fiducial mark on the object at a predetermined location on the object and at a predetermined angular orientation with respect to the object;

an image processing system that uses the vision tool to process the image and locate the fiducial mark in the image and to determine its location and angular orientation with respect to the fixed coordinate system; and an object processing system that uses the location and angular orientation of the fiducial mark to calculate the location and angular orientation of the object with respect to the fixed coordinate system.

9. The apparatus of claim 8 wherein the vision tool is a multiple pattern normalized correlation tool.

10. The apparatus of claim 8 wherein the vision tool is a geometrical pattern matching tool.

11. The apparatus of claim 8 wherein the image processing system comprises a mechanism other than the vision tool that locates a selected area of the object and wherein the vision tool processes an image of the selected area.

12. The apparatus of claim 8 wherein the image processing system comprises a mechanism that determines the location and angular orientation of the fiducial mark directly from the outputs of the vision tool.

13. The apparatus of claim 8 wherein the image processing system comprises a mechanism that calculates the location and angular orientation of the fiducial mark from the outputs of the vision tool.

14. The apparatus of claim 8 wherein the fiducial mark is a Universal Alignment Target.

15. A method for determining the location and angular alignment of an object with respect to a fixed coordinate system in a machine vision system with a camera and processing system for obtaining an image of the object and a vision tool capable of aligning location and at least one other non-translational degree of freedom, the method comprising:

(a) selecting a single pre-existing non-rotationally symmetric feature that is at a predetermined location on the object and at a predetermined angular orientation with respect to the object;

(b) using the vision tool to process the image and locate the feature in the image and to determine its location and angular orientation with respect to the fixed coordinate system; and (c) using the location and angular orientation of the feature to calculate the location and angular orientation of the object with respect to the fixed coordinate system.

16. The method of claim 15 wherein the vision tool is a multiple pattern normalized correlation tool.

17. The method of claim 15 wherein the vision tool is a geometrical pattern matching tool.

18. The method of claim 15 wherein step (b) comprises locating a selected area of the object by means other than the vision tool and using the vision tool to process an image of the selected area.

19. The method of claim 15 wherein step (b) comprises determining the location and angular orientation of the feature directly from the outputs of the vision tool.

20. The method of claim 15 wherein step (b) comprises calculating the location and angular orientation of the feature from the outputs of the vision tool.

21. Apparatus for determining the location and angular alignment of an object with respect to a fixed coordinate system in a machine vision system with a camera and processing system for obtaining an image of the object and a vision tool capable of aligning location and at least one other non-translational degree of freedom, the apparatus comprising:

means for selecting a single preexisting non-rotationally symmetric feature that is at a predetermined location on the object and at a predetermined angular orientation with respect to the object;

an image processing system that uses the vision tool to process the image and locate the feature in the image and to determine its location and angular orientation with respect to the fixed coordinate system; and an object processing system that uses the location and angular orientation of the feature to calculate the location and angular orientation of the object with respect to the fixed coordinate system.

22. The apparatus of claim 21 wherein the vision tool is a multiple pattern normalized correlation tool.

23. The apparatus of claim 21 wherein the vision tool is a geometrical pattern matching tool.

24. The apparatus of claim 21 wherein the image processing system comprises a mechanism other than the vision tool that locates a selected area of the object and wherein the vision tool processes an image of the selected area.

25. The apparatus of claim 21 wherein the image processing system comprises a mechanism that determines the location and angular orientation of the feature directly from the outputs of the vision tool.

26. The apparatus of claim 21 wherein the image processing system comprises a mechanism that calculates the location and angular orientation of the feature from the outputs of the vision tool.

27. A machine vision system for determining the location and angular alignment of an object with respect to a fixed coordinate system, comprising:

a camera and processing system for obtaining an image of the object;

a vision tool capable of aligning location and at least one other non-translational degree of freedom;

means for selecting a single non-rotationally symmetric feature that is at a predetermined location on the object and at a predetermined angular orientation with respect to the object;

an image processing system that uses the vision tool to process the image and locate the feature in the image and to determine its location and angular orientation with respect to the fixed coordinate system; and an object processing system that uses the location and angular orientation of the feature to calculate the location and angular orientation of the object with respect to the fixed coordinate system.

28. The machine vision system of claim 27 wherein the feature is a fiducial mark placed on the object for the purpose of calculating the location and angular orientation of the object.

29. The machine vision system of claim 27 wherein the feature is a pre-existing feature on the object.

* * * * *